United States Patent
Shao et al.

(10) Patent No.: US 12,309,992 B2
(45) Date of Patent: May 20, 2025

(54) SEMICONDUCTOR STRUCTURE AND FORMATION METHOD THEREOF, AND MEMORY

(71) Applicant: CHANGXIN MEMORY TECHNOLOGIES, INC., Hefei (CN)

(72) Inventors: Guangsu Shao, Hefei (CN); Deyuan Xiao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 526 days.

(21) Appl. No.: 17/879,790

(22) Filed: Aug. 3, 2022

(65) Prior Publication Data

US 2023/0380131 A1 Nov. 23, 2023

(30) Foreign Application Priority Data

May 20, 2022 (CN) .......................... 202210557099.X

(51) Int. Cl.
*H10B 12/00* (2023.01)

(52) U.S. Cl.
CPC .................................. *H10B 12/00* (2023.02)

(58) Field of Classification Search
CPC ...... H10B 12/00; H10B 12/34; H10B 12/053; H10B 12/488; H10B 12/482; H10B 12/485; H10B 12/038; H10B 12/0385; H10B 12/0387; Y02D 10/00
See application file for complete search history.

(56) References Cited

U.S. PATENT DOCUMENTS

| | | | | | |
|---|---|---|---|---|---|
| 4,763,180 | A | * | 8/1988 | Hwang | H10B 12/395 438/269 |
| 5,214,603 | A | * | 5/1993 | Dhong | H10B 12/373 365/207 |
| 5,497,017 | A | * | 3/1996 | Gonzales | H10B 12/318 257/302 |
| 2002/0076880 | A1 | * | 6/2002 | Yamada | H10B 12/0383 257/E21.655 |
| 2004/0245577 | A1 | * | 12/2004 | Bhattacharyya | H10D 86/01 257/65 |
| 2007/0082444 | A1 | * | 4/2007 | Chien | H10B 12/395 438/257 |
| 2007/0145367 | A1 | * | 6/2007 | Chen | H01L 24/83 257/E27.026 |
| 2008/0233706 | A1 | * | 9/2008 | Chou | H10D 1/665 438/387 |

(Continued)

*Primary Examiner* — Bitew A Dinke
(74) *Attorney, Agent, or Firm* — Kilpatrick Townsend & Stockton LLP

(57) ABSTRACT

Embodiments relate to a semiconductor structure and a formation method. The formation method includes: forming a first active layer on a side of the substrate; forming a first word line in each of the plurality of active areas; forming a first bit line and a conductive contact plug on a top of the first active layer; forming a gate dielectric layer on a side of the first active layer, a side of the first bit line, and a side of the conductive contact plug facing away from the substrate, respectively; forming a second active layer on a side of the gate dielectric layer facing away from the substrate; and forming a second bit line and a second word line on a side of the second active layer facing away from the substrate, where the second bit line and the second word line touch and connect the second active layer, respectively.

16 Claims, 7 Drawing Sheets

(56) References Cited

U.S. PATENT DOCUMENTS

| | | | | |
|---|---|---|---|---|
| 2008/0305592 | A1* | 12/2008 | Chien | H10B 12/395 |
| | | | | 438/243 |
| 2010/0283093 | A1* | 11/2010 | Pei | H10B 12/038 |
| | | | | 257/E27.071 |
| 2011/0140183 | A1* | 6/2011 | Nagai | H10D 84/013 |
| | | | | 257/296 |
| 2013/0153847 | A1* | 6/2013 | Park | H10D 88/00 |
| | | | | 257/E45.001 |
| 2013/0221356 | A1* | 8/2013 | Yamazaki | H10B 12/00 |
| | | | | 257/296 |
| 2014/0042445 | A1* | 2/2014 | Kao | H10F 39/18 |
| | | | | 257/E31.043 |
| 2016/0104745 | A1* | 4/2016 | Park | H10B 61/22 |
| | | | | 257/421 |
| 2017/0033157 | A1* | 2/2017 | Shoji | H10B 61/22 |
| 2019/0006222 | A1* | 1/2019 | Or-Bach | H10B 12/50 |
| 2019/0096880 | A1* | 3/2019 | Lin | H01L 23/5222 |
| 2020/0266229 | A1* | 8/2020 | Takahashi | H10F 39/018 |
| 2021/0020628 | A1* | 1/2021 | Oh | H10D 88/01 |
| 2021/0151437 | A1 | 5/2021 | Tomishima | |
| 2021/0398948 | A1* | 12/2021 | Kim | H10D 84/834 |
| 2021/0408007 | A1* | 12/2021 | Ishigami | H10B 12/482 |
| 2022/0139916 | A1* | 5/2022 | Kwak | H10D 30/63 |
| | | | | 257/300 |
| 2022/0216239 | A1* | 7/2022 | Yoo | H10B 86/201 |
| 2022/0285350 | A1* | 9/2022 | Okajima | H10D 30/6755 |
| 2023/0143132 | A1* | 5/2023 | Lee | G11C 11/4091 |
| | | | | 365/230.06 |

* cited by examiner

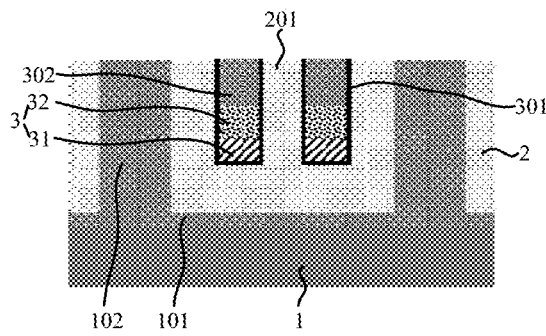

Fig. 8

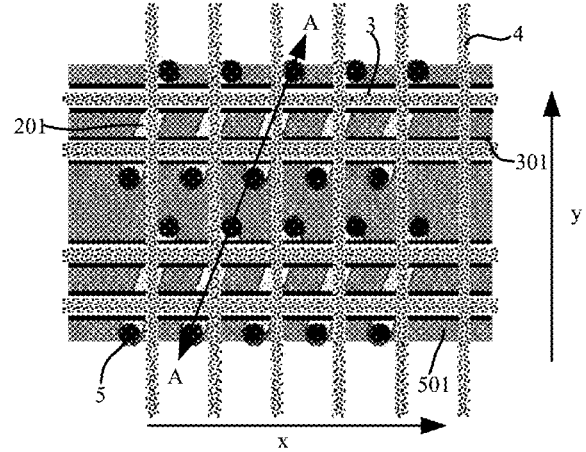

Fig. 9

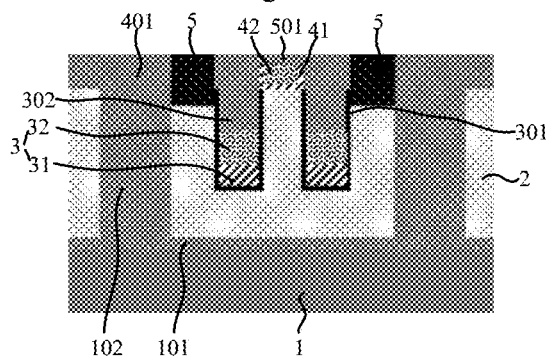

Fig. 10

| Form a second insulating layer covering a surface of the first active layer and a surface of the first word line | S410 |

| Pattern the second insulating layer to form a plurality of first bit line trenches arranged at intervals and extending along a second direction, where each of the first bit line trenches exposes a first end of one of the plurality of active areas, and the second direction intersects the first direction | S420 |

| Form the first bit line in each of the first bit line trenches | S430 |

Fig. 11

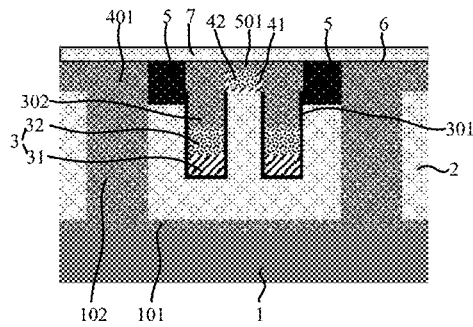

Fig. 16

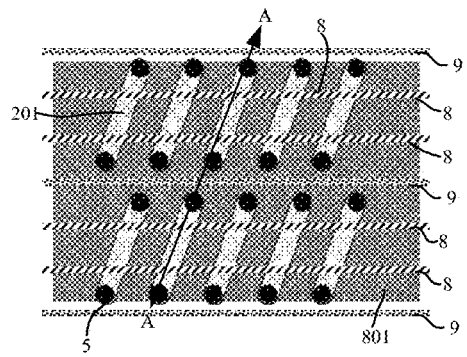

Fig. 17

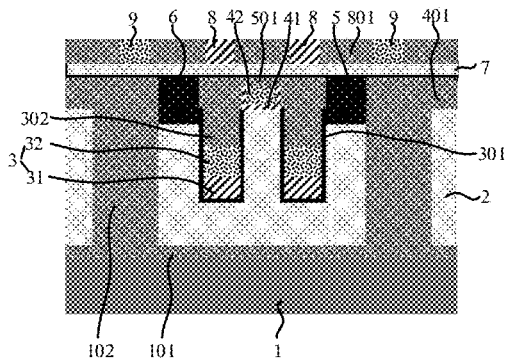

Fig. 18

| Form a fourth insulating layer on a side of the second active layer facing away from the substrate | — S610 |

| Etch the fourth insulating layer using the second active layer as an etching stop layer to form, in the fourth insulating layer, a plurality of second bit line trenches arranged at intervals and extending along the first direction and a plurality of second word line trenches arranged at intervals and extending along the first direction, where an orthographic projection of each of the second bit line trenches on the substrate is overlapped with an orthographic projection of each of the active areas on the substrate, and an orthographic projection of each of the second word line trenches on the substrate is not overlapped with the orthographic projection of each of the active areas on the substrate | — S620 |

| Form a second bit line in each of the second bit line trenches, and form a second word line in each of the second word line trenches | — S630 |

Fig. 19

SEMICONDUCTOR STRUCTURE AND FORMATION METHOD THEREOF, AND MEMORY

CROSS-REFERENCE TO RELATED APPLICATION

This application claims priority to Chinese Patent Application No. 202210557099.X, titled "SEMICONDUCTOR STRUCTURE AND FORMATION METHOD THEREOF, AND MEMORY" and filed to the State Patent Intellectual Property Office on May 20, 2022, the entire contents of which are incorporated herein by reference.

TECHNICAL FIELD

The present disclosure relates to the field of semiconductor technology, and more particularly, to a semiconductor structure and a formation method thereof, and a memory.

BACKGROUND

Dynamic Random Access Memory (DRAM) is widely used in mobile devices such as mobile phones and tablet computers due to its advantages of small size, high integration and fast transmission speed, etc. An existing DRAM mainly includes a transistor and a capacitor. However, in a process of data storage, the capacitor has a shorter charge retention time, and charges in the capacitor need to be refreshed continuously to avoid data loss, resulting in larger power consumption and leakage current of a device.

It is to be noted that the information disclosed in the above background art section is only for enhancement of understanding of the background of the present disclosure, and therefore may include information that does not constitute the prior art that is already known to a person of ordinary skill in the art.

SUMMARY

In view of this, the present disclosure provides a semiconductor structure and a formation method thereof, and a memory.

According to an aspect of the present disclosure, there is provided a method for forming a semiconductor structure, and the method includes:
providing a substrate;
forming a first active layer on a side of the substrate, the first active layer comprising a plurality of active areas arranged at intervals;
forming a first word line in each of the plurality of active areas;
forming a first bit line and a conductive contact plug on a top of the first active layer, the first bit line, the conductive contact plug and the first word line being insulated from one another;
forming a gate dielectric layer on a side of the first active layer, a side of the first bit line, and a side of the conductive contact plug facing away from the substrate, respectively;
forming a second active layer on a side of the gate dielectric layer facing away from the substrate; and
forming a second bit line and a second word line on a side of the second active layer facing away from the substrate, the second bit line and the second word line touching and connecting the second active layer, respectively.

According to an aspect of the present disclosure, there is provided a semiconductor structure, which includes:
a substrate;
a first active layer positioned on a side of the substrate, the first active layer comprising a plurality of active areas arranged at intervals;
a first word line structure comprising a plurality of first word lines arranged at intervals, each of the plurality of first word lines extending along a first direction, and each of the plurality of first word lines passing through the plurality of active areas;
a first bit line structure comprising a plurality of first bit lines arranged at intervals, each of the plurality of first bit lines extending along a second direction, each of the plurality of first bit lines being connected to a first end of a given one of the plurality of active areas, and the first direction intersecting with the second direction;
a conductive contact structure comprising a plurality of conductive contact plugs, each of the plurality of conductive contact plugs being connected to a second end of the given active area, and the first end and the second end being positioned on two sides of each of the plurality of first word lines, respectively;
a gate dielectric layer positioned on a side of the first active layer, a side of the first bit line structure, and a side of the conductive contact structure facing away from the substrate, respectively;
a second active layer positioned on a side of the gate dielectric layer facing away from the substrate;
a second word line structure positioned on a side of the second active layer facing away from the substrate, the second word line structure comprising a plurality of second word lines, each of the plurality of second word lines being connected to a first region of the second active layer; and
a second bit line structure positioned on a side of the second active layer facing away from the substrate, the second bit line structure comprising a plurality of second bit lines, each of the plurality of second bit lines being connected to a second region of the second active layer;
wherein an orthographic projection of each of the plurality of conductive contact plugs on the second active layer is positioned between the first region and the second region.

It is to be understood that the above general description and the detailed description below are merely exemplary and explanatory, and do not limit the present disclosure.

BRIEF DESCRIPTION OF THE DRAWINGS

The accompanying drawings here are incorporated in and constitute a part of this specification, illustrate embodiments conforming to the present disclosure and, together with the specification, serve to explain the principles of the present disclosure. Apparently, the accompanying drawings in the following description show merely some embodiments of the present disclosure, and persons of ordinary skill in the art may still derive other drawings from these accompanying drawings without creative efforts.

FIG. 8 is a schematic diagram cut along an AA direction in FIG. 7;

FIG. 9 is a top view after completing Step S140 according to an embodiment of the present disclosure;

FIG. 10 is a schematic diagram cut along the AA direction in FIG. 9;

FIG. 11 is a flowchart of forming a first bit line according to an embodiment of the present disclosure;

FIG. 16 is a schematic diagram after completing Step S160 according to an embodiment of the present disclosure;

FIG. 17 is a top view after completing Step S170 according to a first embodiment of the present disclosure;

FIG. 18 is a schematic diagram cut along an AA direction in FIG. 17;

FIG. 19 is a flowchart of Step S170 according to a first embodiment of the present disclosure;

REFERENCE NUMERALS IN THE ATTACHED DRAWINGS

1—substrate; 101—first insulating layer; 102—isolation structure; 2—first active layer; 201—active area; 3—first word line; 31—first conductive layer; 32—second conductive layer; 301—first dielectric layer; 302—passivation layer; 303—first word line trench; 4—first bit line; 41—third conductive layer; 42—fourth conductive layer; 401—second insulating layer; 5—conductive contact plug; 501—third insulating layer; 6—gate dielectric layer; 7—second active layer; 8—second bit line; 801—fourth insulating layer; 9—second word line; 901—fifth insulating layer; 91—first conductive structure; and 92—second conductive structure.

DETAILED DESCRIPTION

Exemplary embodiments will now be described more comprehensively with reference to the accompanying drawings. However, the exemplary embodiments may be carried out in various manners, and shall not be interpreted as being limited to the embodiments set forth herein; instead, providing these embodiments will make the present disclosure more comprehensive and complete, and will fully convey the conception of the exemplary embodiments to those skilled in the art. Throughout the drawings, similar reference signs indicate the same or similar structures, and thus their detailed description will be omitted. In addition, the accompanying drawings are merely exemplary illustration of the present disclosure, and are not necessarily drawn to scale.

Although this specification employs relativity terms such as "above" and "below" to describe a relative relation between one component and another component of icons, these terms are merely for convenience of this specification, for example, the directions of the examples in the accompanying drawings. It is to be understood that when the apparatus of the icon are turned upside down, components described as "above" will become components described as "below". When a certain structure is "above" other structures, it likely means that the certain structure is integrally formed on the other structures, or the certain structure is "directly" arranged on the other structures, or the certain structure is "indirectly" arranged on the other structures by means of another structure.

The terms "one", "a", "said", "the" and "at least one" may be intended to indicate presence of one or more elements/constituent parts, etc. The terms "comprising" and "having" are inclusive and therefore specify the presence of other elements/constituent parts or the like in addition to the elements/constituent parts listed out. The terms "first", "second" . . . and "fifth" or the like are merely for marker purposes, and do not impose numerical limitations on objects thereof.

Figure 1:
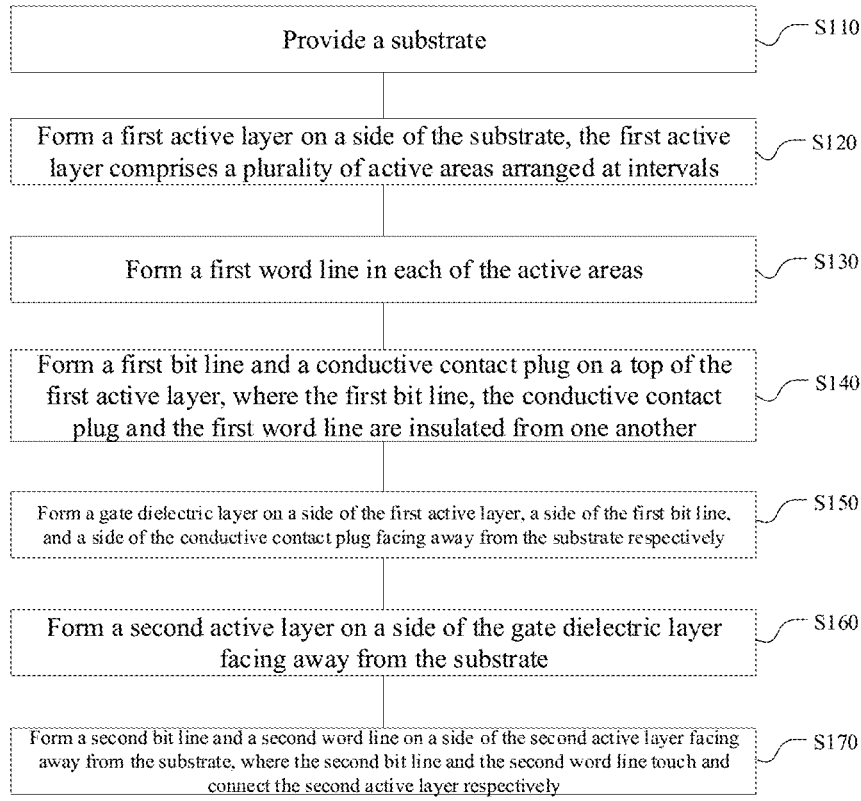
FIG. 1 is a flowchart of a method for forming a semiconductor structure according to an embodiment of the present disclosure.

An embodiment of the present disclosure provides a method for forming a semiconductor structure. As shown in FIG. 1, the formation method may include Steps S110 to S170:

Step S110: providing a substrate;

Step S120: forming a first active layer on a side of the substrate, the first active layer comprising a plurality of active areas arranged at intervals;

Step S130: forming a first word line in each of the plurality of active areas;

Step S140: forming a first bit line and a conductive contact plug on a top of the first active layer, where the first bit line, the conductive contact plug and the first word line are insulated from one another;

Step S150: forming a gate dielectric layer on a side of the first active layer, a side of the first bit line, and a side of the conductive contact plug facing away from the substrate, respectively;

Step S160: forming a second active layer on a side of the gate dielectric layer facing away from the substrate; and Step S170: forming a second bit line and a second word line on a side of the second active layer facing away from the substrate, where the second bit line and the second word line touch and connect the second active layer, respectively.

In the method for forming a semiconductor structure provided by the present disclosure, the first bit line and the conductive contact plug may be used as a source and a drain respectively, and jointly constitute a 6F$^2$ buried transistor with the first word line, which may improve integration of a device, where the transistor may be used as a write transistor of a dynamic random access memory (DRAM) to control data writing. Moreover, the second bit line and the second word line may be used as a source and a drain respectively, and jointly constitute a planar transistor with the conductive contact plug (serving as a gate), where this transistor may be used as a read transistor of the DRAM to read data. A parasitic capacitor of the read transistor may be used as a memory cell to complete charge storage. Moreover, the integration of the device may be improved by combining the planar transistor with a $6F^2$ DRAM architecture, which facilitates integrated design. In this process, in one aspect, because charge retention time of the transistor is longer than that of a conventional capacitor, it is not necessary to refresh too frequently, and the power consumption of the device is lower. In another aspect, because a second active layer is positioned between the gate dielectric layer and the second word line, a physical size between the second word line and the conductive contact plug is increased, and an electric field between the drain and the gate is reduced, thereby reducing a leakage current of the drain. Moreover, due to the increase of the physical size, the gate dielectric layer may be effectively prevented from breaking down, the standby power consumption may be effectively reduced, and reliability of the device is improved. In addition, because the read transistor and the write transistor share one electrode (the conductive contact plug), the gate of the read transistor and the drain of the write transistor are the same electrode, and charges in a gate capacitor of the read transistor may be changed by means of the write transistor, to complete data writing and reading.

Details of the method for forming a semiconductor structure in this embodiment of the present disclosure will be described in detail below.

As shown in FIG. 1, in Step S110, a substrate is provided.

Figure 2:
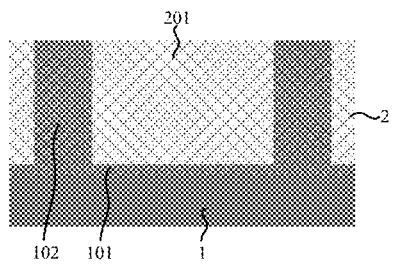
FIG. 2 is a schematic diagram of a first active layer according to an embodiment of the present disclosure.

As shown in FIG. 2, the substrate 1 may have a flat plate structure, which may be rectangular, circular, elliptical, polygonal or irregular in shape, and a material of the substrate 1 may be a semiconductor material such as silicon, but not limited to silicon or other semiconductor materials. Neither the shape nor the material of the substrate 1 are specially limited here.

As shown in FIG. 1, in Step S120, a first active layer is formed on a side of the substrate, where the first active layer includes a plurality of active areas arranged at intervals.

In one embodiment, a material of the first active layer 2 may be an amorphous material, for example, indium gallium zinc oxide (IGZO), indium gallium zinc tin oxide (IGZTO), indium tin oxide (ITO), and indium titanium oxide (ITiO), etc. In some embodiments, the material of the first active layer 2 may be indium gallium zinc oxide (IGZO). A plurality of active areas 201 may be formed in the first active layer 2 by means of a patterning process, where the plurality of active areas 201 may be arranged at intervals.

Figure 3:
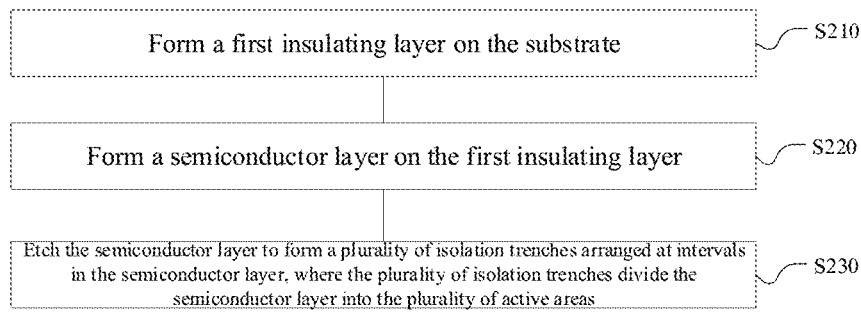
FIG. 3 is a flowchart of Step S120 according to an embodiment of the present disclosure.

In an exemplary embodiment of the present disclosure, the forming the first active layer 2 on a side of the substrate 1 may include Steps S210 to S230, as shown in FIG. 3.

In Step S210, a first insulating layer is formed on the substrate.

In an exemplary embodiment of the present disclosure, a first insulating layer 101 may be positioned on a surface of the substrate 1, and the substrate 1 may be separated from other film layers by means of the first insulating layer 101 to prevent impurities in the substrate 1 from diffusing into the other film layers, which is advantageous to ensuring stability of a device.

The first insulating layer 101 may be a thin film formed on the surface of the substrate 1 or a coating formed on the surface of the substrate 1, which is not particularly limited herein. In one embodiment, the first insulating layer 101 may be formed on the surface of the substrate 1 by means of chemical vapor deposition, physical vapor deposition, atomic layer deposition, thermal evaporation, vacuum evaporation, or magnetron sputtering, etc. Of course, the first insulating layer 101 may also be formed in other ways, which is not particularly limited herein.

A material of the first insulating layer 101 may be an insulating material, for example, silicon dioxide, a high-k dielectric material or other dielectric materials, or any combination thereof. A thickness of the first insulating layer 101 may be set according to actual needs.

In Step S220, a semiconductor layer is formed on the first insulating layer.

A semiconductor layer may be formed on a surface of the first insulating layer 101 facing away from the substrate 1, where the semiconductor layer may be a thin film formed on the surface of the first insulating layer 101 or a coating formed on the surface of the first insulating layer 101, which is not particularly limited herein. In one embodiment, the semiconductor layer may be formed on the surface of the first insulating layer 101 by means of chemical vapor deposition, physical vapor deposition, atomic layer deposition, thermal evaporation, vacuum evaporation, or magnetron sputtering. Of course, the semiconductor layer may also be formed in other ways, which is not particularly limited here.

In one embodiment, a material of the semiconductor layer may be an amorphous material, for example, indium gallium zinc oxide (IGZO), indium gallium zinc tin oxide (IGZTO), indium tin oxide (ITO), and indium titanium oxide (ITiO), etc. In some embodiments, the material of the semiconductor layer may be indium gallium zinc oxide (IGZO). A thickness of the semiconductor layer may be set according to actual requirements.

In Step S230, the semiconductor layer is etched to form a plurality of isolation trenches arranged at intervals in the semiconductor layer, where the plurality of isolation trenches divide the semiconductor layer into the plurality of active areas.

Anisotropic etching may be performed on the semiconductor layer by means of an etching process to form a plurality of isolation trenches arranged at intervals in the semiconductor layer, each isolation trench may penetrate through the semiconductor layer and expose the first insulating layer 101, and the isolation trenches may divide the semiconductor layer into a plurality of active areas 201. That is, the active areas 201 may be separated by the isolation trenches, to avoid coupling or short circuit between structures in adjacent active areas 201. The active areas 201 may be arranged at intervals in rows and/or columns. A cross section of each active area 201 may be in a waist circle or a rectangle, and of course, other shapes are also acceptable. Neither the shape nor the cross section of the active area 201 is particularly limited herein.

For example, a photoresist layer may be formed on the surface of the semiconductor layer by means of spin coating or by other means, where a material of the photoresist layer may be positive photoresist or negative photoresist, which is not particularly limited herein. A shape of a surface of the photoresist layer distant from the semiconductor layer may be the same as that of the surface of the semiconductor layer. The photoresist layer may be exposed by means of a mask, where a pattern of the mask may be matched to a desired pattern of the isolation trench. Subsequently, the exposed photoresist layer may be developed to form a development region, which may expose the semiconductor layer. A pattern of the development region may be the same as the desired pattern of the isolation trench, and a size of the development region may be the same as that of the desired isolation trench. The semiconductor layer may be etched using the first insulating layer 101 as an etching stop layer by means of a dry etching process, to expose the first insulating layer 101.

In an exemplary embodiment of the present disclosure, the isolation trench may be filled with an isolation material to form an isolation structure 102. A material of the isolation structure 102 may include silicon nitride, silicon oxide, or a combination of the two, which is not particularly limited herein. A shape of a cross section of the isolation structure 102 may be set according to actual requirements.

In some other embodiments, when the first active layer 2 is formed on a side of the substrate 1, a thicker insulating layer may be formed on the substrate 1, the insulating layer may be etched to form a plurality of active trenches arranged at intervals, and each active trench is filled with an active material to form the active area 201. It should be noted that it is not necessary to etch through the insulating layer during the etching process, such that a part of the insulating layer is retained between the substrate 1 and the active material to prevent impurities in the substrate 1 from diffusing into the active area 201.

As shown in FIG. 1, in Step S130, a first word line is formed in each of the active areas.

The active areas may be etched to form first word line trenches, and first word lines may be formed within each of the first word line trenches. For example, two first word line trenches arranged at intervals may be etched in each active area, and the two first word line trenches may be arranged in parallel. The two first word line trenches in adjacent two active areas may be communicated with each other, and a first word line may be formed in each of the two first word line trenches.

Figure 4:
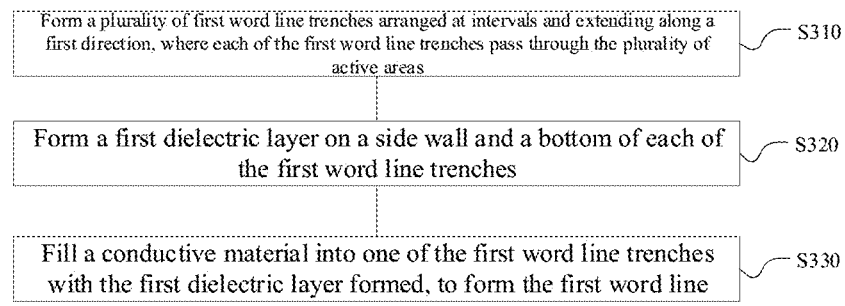
FIG. 4 is a flowchart of Step S130 according to an embodiment of the present disclosure.

In an exemplary embodiment of the present disclosure, the forming the first word line in each active area 201 may include Steps S310 to S330, as shown in FIG. 4.

In Step S310, a plurality of first word line trenches arranged at intervals and extending along a first direction are formed, where each of the plurality of first word line trenches passes through the plurality of active areas.

Figure 5:
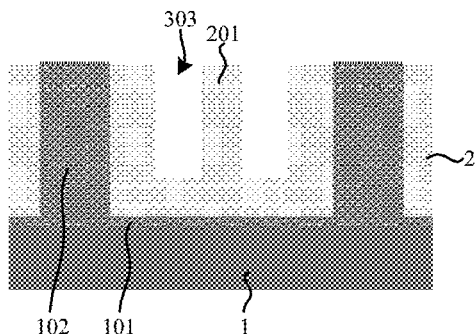
FIG. 5 is a schematic diagram after completing Step S310 according to an embodiment of the present disclosure.

As shown in FIG. 5, each active area 201 and the isolation material between adjacent active areas 201 may be etched, such that a plurality of first word line trenches 303 passing through each active area 201 may be formed, where the first word line trenches 303 may extend along the first direction and are arranged at intervals along the second direction. In the first direction, two ends of each first word line trench 303 may be penetrable and may be in a strip shape, and the first word line trenches 303 in the strip shape may be arranged in parallel.

In some embodiments, the photoresist layer may be formed on the surface of the first active layer 2 facing away from the substrate 1 and the surface of the isolation material facing away from the substrate 1 by means of spin coating or in other ways; and a material of the photoresist layer may be positive photoresist or negative photoresist, which is not particularly limited herein.

The photoresist layer may be exposed by means of a mask, where a pattern of the mask may be matched to a desired pattern of the first trench 303. Subsequently, the exposed photoresist layer may be developed to form a plurality of developing regions, where each developing region may expose the first active layer 2 and the isolation material, a pattern of each developing region may be the same as a required pattern of each first word line trench 303, and a size of each developing region may be matched with a required size of the first word line trench 303.

The first active layer 2 and the isolation material may be etched in each developing region by means of a plasma etching process, such that the first word line trenches 303 are formed in the first active layer 2 and the isolation material. After the above etching process is completed, the photoresist layer may be removed by cleaning with a cleaning solution or by means of ashing or other processes.

It should be noted that the first direction may be any one of lateral extension directions of the substrate 1, and the first direction is not particularly limited herein. The second direction may intersect the first direction, e.g., the first direction may be perpendicular to the second direction. It is to be noted that the perpendicular may be absolutely perpendicular or approximately perpendicular, this is because deviations are unavoidable in manufacturing processes. In the present disclosure, deviation of an angle may be caused by limitations of fabrication technologies, such that there is a certain deviation of an angle between the first direction and the second direction. However, it may be considered that the first direction is perpendicular to the second direction as long as the deviation of the angle between the first direction and the second direction is within a preset range. For example, the preset range may be 10°. That is, when the angle between the first direction and the second direction is within a range of greater than or equal to 80° and less than or equal to 100°, it may be considered that the first direction is perpendicular to the second direction.

In Step S320, a first dielectric layer is formed on a side wall and a bottom of each of the first word line trenches.

Figure 6:
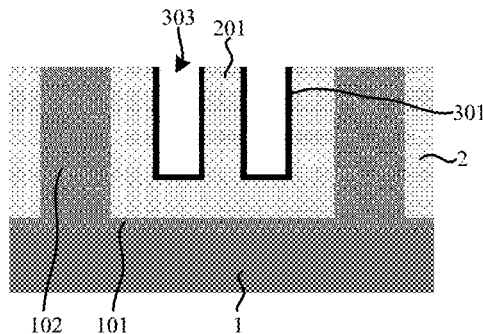
FIG. 6 is a schematic diagram after completing Step S320 according to an embodiment of the present disclosure.

As shown in FIG. 6, the first dielectric layer 301 may be a thin film formed on a side wall and a bottom of each first word line trench 303, or may be a coating formed on the side wall and the bottom of each first word line trench 303, which is not particularly limited herein. The first dielectric layer 301 may be made of an insulating material, for example, silicon oxide. The first dielectric layer 301 may be formed on the side wall and the bottom of each first word line trench 303 by means of chemical vapor deposition, physical vapor deposition, atomic layer deposition, thermal evaporation, vacuum evaporation, or magnetron sputtering. Of course, the first dielectric layer 301 may also be formed on the side wall and the bottom of each first word line trench 303 in other ways, which are not to be listed one by one herein.

In one embodiment, a thickness of the first dielectric layer 301 may be 2 nm to 5 nm. For example, the thickness of the first dielectric layer 301 may be 2 nm, 3 nm, 4 nm, or 5 nm. Of course, the first dielectric layer 301 may also have other thicknesses, which are not to be listed one by one herein.

In Step S330, a conductive material is filled into the first word line trench with the first dielectric layer formed, to form the first word line.

Figure 7:
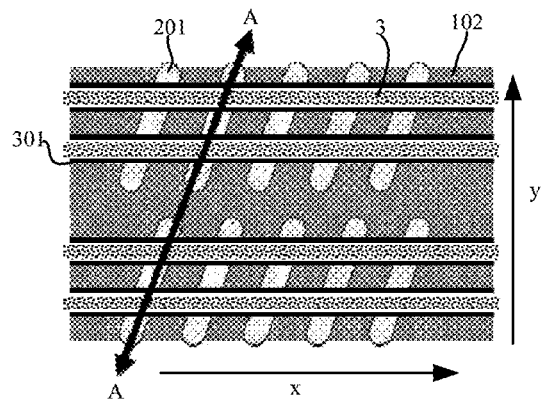
FIG. 7 is a top view after completing Step S330 according to an embodiment of the present disclosure.

As shown in FIG. 7 and FIG. 8, after the first dielectric layer 301 is formed, each of the first word line trenches 303 may be filled with the conductive material, to form the first word line 3 in each of the first word line trenches 303. In one embodiment, the first word line 3 may include a first conductive layer 31 and a second conductive layer 32, and the first conductive layer 31 and the second conductive layer 32 may be sequentially formed in the first word line trench 303.

For example, the first conductive layer 31 may be a thin film formed at the bottom of each first word line trench 303, and a material thereof may be titanium nitride. The first conductive layer 31 may be formed at the bottom of each first word line trench 303 by means of atomic layer deposition, the first conductive layer 31 may be in conformal contact with the first dielectric layer 301 on the side wall and the bottom of the first word line trench 303, and the surface of the first conductive layer 31 facing away from the substrate 1 may be lower than a top surface of each first word line trench 303.

The second conductive layer 32 may be a thin film formed on a side of the first conductive layer 31 facing away from the substrate 1, and a material thereof may be tungsten. The second conductive layer 32 may be formed on the side of the first conductive layer 31 facing away from the substrate 1 by means of vacuum evaporation, magnetron sputtering, or atomic layer deposition, the second conductive layer 32 may be in contact with the first conductive layer 31, and a surface of the second conductive layer 32 facing away from the first conductive layer 31 may be lower than the top surface of each first word line trench 303.

In an exemplary embodiment of the present disclosure, each first word line 3 may further include a passivation layer 302. The passivation layer 302 may be a thin film formed on a side of the second conductive layer 32 facing away from the first conductive layer 31, and may be configured to protect the surface of the second conductive layer 32, where a material of the passivation layer 302 may be silicon oxide or silicon nitride. The passivation layer 302 may be formed on the side of the second conductive layer 32 facing away from the first conductive layer 31 by means of chemical vapor deposition or physical vapor deposition. It should be noted that the surface of the passivation layer 302 facing away from the second conductive layer 32 may be flush with the surface of the first active layer 2.

As shown in FIG. 1, in Step S140, a first bit line and a conductive contact plug are formed on a top of the first active layer, where the first bit line, the conductive contact plug and the first word line are insulated from one another.

As shown in FIG. 9 and FIG. 10, a first bit line 4 and a conductive contact plug 5 may be formed at the top of the first active layer 2, respectively. The first bit line 4 and the conductive contact plug 5 may be used as a source and a drain, respectively, and jointly constitute a 6F$^2$ buried transistor with the first word line 3, which may improve the integration of the device, where the transistor may be used as a write transistor of the DRAM to control data writing.

For example, the first bit line 4 and the conductive contact plug 5 may be formed at the top of the first active layer 2 on two sides of each first word line trench 303, respectively. The first bit line 4, the first word line 3, and the conductive contact plugs 5 may be separated by insulating materials to avoid coupling or short circuit between the structures. For example, the first bit line 4, the first word line 3, and the conductive contact plug 5 may be separated by the first dielectric layer 301 and/or the passivation layer 302.

In an exemplary embodiment of the present disclosure, the forming the first bit line 4 may include Steps S410-S430, as shown in FIG. 11.

In Step S410, a second insulating layer is formed, where the second insulating layer covers a surface of the first active layer and a surface of the first word line.

Figure 12:
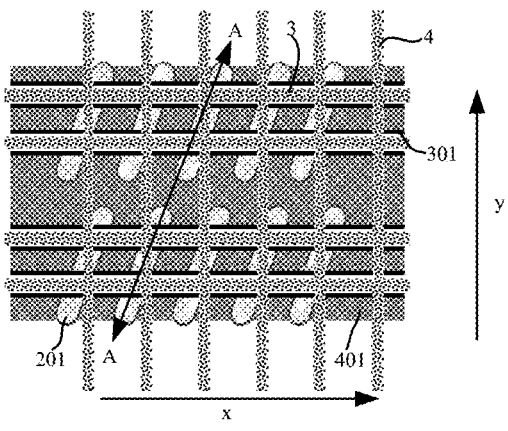
FIG. 12 is a schematic diagram of a first bit line according to an embodiment of the present disclosure.
Figure 13:
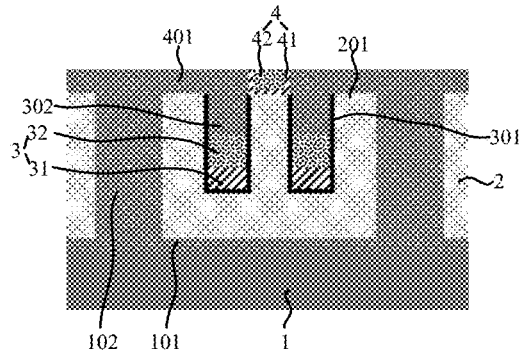
FIG. 13 is a schematic diagram cut along the AA direction in FIG. 12.

As shown in FIG. 12 and FIG. 13, a second insulating layer 401 may be formed on a surface of a structure jointly constituted by the first word line 3 and the first active layer 2. An orthographic projection of the first word line 3 on the substrate 1 and an orthographic projection of the first active layer 2 on the substrate 1 may be within an orthographic projection of the second insulating layer 401 on the substrate 1. For example, the second insulating layer 401 may cover the surface of the first active layer 2 on two sides of the first word line trench 303 and the surface of the passivation layer 302.

In one embodiment, for convenience of processes, the second insulating layer 401 may cover the top of the isolation structure 102 simultaneously. That is, the second insulating layer 401 may simultaneously cover the surface of the first active layer 2 on two sides of the first word line trench 303, the surface of the passivation layer 302, and the top of the isolation structure 102.

In an exemplary embodiment of the present disclosure, a material of the second insulating layer 401 may be the same as that of the first insulating layer 101, for example, silicon oxide. The second insulating layer 401 may be formed at the top of the first active layer 2 and the top of the first word line 3 by means of chemical vapor deposition, physical vapor deposition, or atomic layer deposition. Of course, the second insulating layer 401 may also be formed by means of other processes. The formation manner of the second insulating layer 401 is not particularly limited herein.

In Step S420, the second insulating layer is patterned to form a plurality of first bit line trenches arranged at intervals and extending along a second direction, where each of the plurality of first bit line trenches exposes a first end of a given one of the plurality of active areas, and the second direction intersects with the first direction.

The second insulating layer 401 may be patterned by means of an etching process to form a plurality of first bit line trenches, where the plurality of first bit line trenches may extend along the second direction y and may be arranged at intervals along the first direction x.

The first bit line trenches may penetrate through the plurality of active areas 201, and an orthographic projection of a first end of each active area 201 on the substrate 1 is at least partially overlapped with an orthographic projection of each first bit line trench on the substrate 1. In one embodiment, in a direction perpendicular to the substrate 1, the first bit line trench may penetrate through the second insulating layer 401 and expose the top of the first active layer 2 at the first end of each active area 201 positioned below the second insulating layer 401.

For example, a photoresist layer may be formed on a surface of the second insulating layer 401 by means of spin coating or by other means, where a material of the photoresist layer may be positive photoresist or negative photoresist, which is not limited herein.

The photoresist layer may be exposed by means of a mask, where a pattern of the mask may be matched to a desired pattern of the first bit line trench. Subsequently, the exposed photoresist layer may be developed to form a plurality of developing regions, where each of the developing regions may expose the second insulating layer 401, a pattern of each developing region may be the same as a required pattern of each first bit line trench, and a size of each developing region may be matched with a required size of the first bit line trench.

The second insulating layer 401 may be etched in the developing region by means of an anisotropic etching process, such that the first bit line trenches are formed in the second insulating layer 401. After the above etching process is completed, the photoresist layer may be removed by cleaning with a cleaning solution or by means of ashing or other processes.

In Step S430, the first bit line is formed in the first bit line trenches.

In one embodiment of the present disclosure, the first bit line 4 may include a third conductive layer 41 and a fourth conductive layer 42. The third conductive layer 41 may be conformally attached to the bottom and the side wall of each first bit line trench, and may touch and connect the first active layer 2 at the bottom of the first bit line trench. The fourth conductive layer 42 may fill up the first bit line trench where the third conductive layer 41 is formed, and is flush with the top surface of the second insulating layer 401. A material of the third conductive layer 41 and a material of the fourth conductive layer 42 may both be conductive materials. For example, the material of the third conductive layer 41 may be titanium nitride, and the material of the fourth conductive layer 42 may be tungsten.

The third conductive layer 41 and the fourth conductive layer 42 may be formed in turn by means of atomic layer deposition, chemical vapor deposition, physical vapor deposition, vacuum evaporation, or magnetron sputtering. Of course, the third conductive layer 41 and the fourth conductive layer 42 may also be formed in other ways, which are not to be listed one by one herein. It should be noted that a formation manner of the third conductive layer 41 and a formation manner of the fourth conductive layer 42 may be the same or may be different, and the formation manner of the third conductive layer 41 and the formation manner of the fourth conductive layer 42 are not particularly limited herein.

Figure 14:
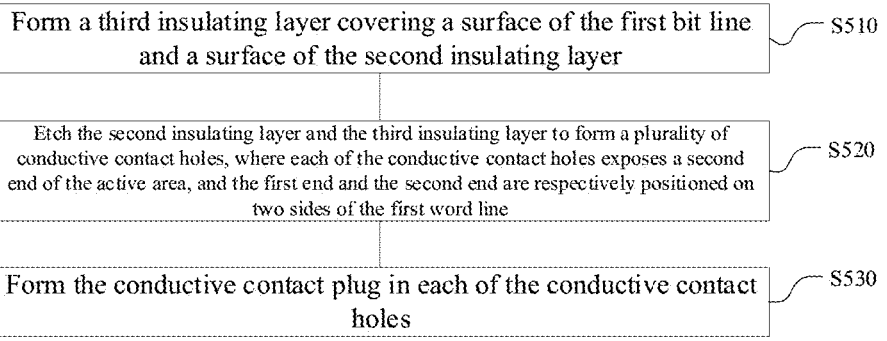
FIG. 14 is a flowchart of forming a conductive contact plug according to an embodiment of the present disclosure.
Figure 15:
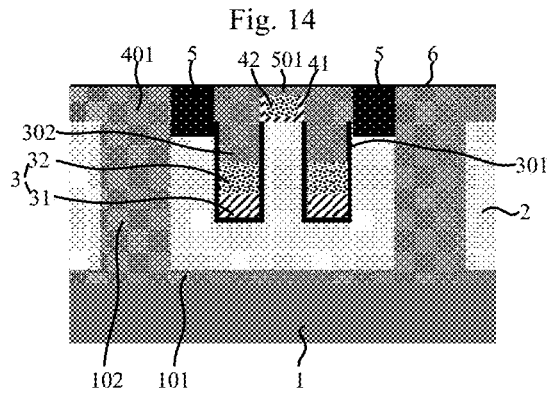
FIG. 15 is a schematic diagram after completing Step S510 according to an embodiment of the present disclosure.

In an exemplary embodiment of the present disclosure, the forming the conductive contact plug 5 may include Steps S510-S530, as shown in FIG. 14.

In Step S510, a third insulating layer is formed, where the third insulating layer covers a surface of the first bit line and a surface of the second insulating layer.

As shown in FIG. 5, after the first bit line 4 is formed, a third insulating layer 501 may be formed on a surface of a structure jointly constituted by the first bit line 4 and the second insulating layer 401. A material of the third insulating layer 501 may be the same as that of the first insulating layer 101, for example, silicon oxide. The third insulating layer 501 may be formed on the surface of the structure jointly constituted by the first line 4 and the second insulating layer 401 by means of chemical vapor deposition, physical vapor deposition, or atomic layer deposition. Of course, the third insulating layer 501 may also be formed in other ways. A formation manner of the third insulating layer 501 is not particularly limited herein.

In Step S520, the second insulating layer and the third insulating layer are etched to form a plurality of conductive contact holes, where each of the plurality of conductive contact holes exposes a second end of the active area, and the first end and the second end are positioned on two sides of the first word line, respectively.

The second insulating layer 401 and the third insulating layer 501 may be etched by means of a photolithography process to form a plurality of conductive contact holes arranged at intervals. The conductive contact holes may be circular holes, rectangular holes, or hole-like structures in an irregular shape, which is not particularly limited herein.

The plurality of conductive contact holes may be arranged in a row and may be arranged at intervals along an extension direction of the first bit line 4. In one embodiment, each first bit line 4 may form a group with each column of conductive contact holes, multiple groups of first bit lines 4 and conductive contact holes may be formed side by side, and columns constituted by the first bit lines 4 and the conductive contact holes in adjacent two groups are alternately arranged. That is, the conductive contact holes are arranged on two sides of the first bit line 4 and may be arranged at intervals along the extension direction of the first bit line 4.

Each conductive contact hole may expose the first active layer 2 at the second end of the active area 201. To ensure connectivity between a structure subsequently formed in the conductive contact hole and the first active layer 2, the first active layer 2 may be etched in the etching process. That is, during the etching process, the second insulating layer 401 and the third insulating layer 501 may be etched through, and simultaneously, a part of the first active layer 2 is etched.

It should be noted that the first end and the second end of the active area 201 may be positioned on two sides of the first word line 3, respectively. When the active area 201 includes two word lines, the active area 201 between the two word lines may be defined as the first end of the active area 201, and the active area 201 of one word line distant from a side of the other word line may be defined as the second end of the active area 201.

In Step S530, the conductive contact plug is formed in each of the conductive contact holes.

The conductive contact holes may be filled with a conductive material to form conductive contact plugs 5 in the conductive contact holes, and the conductive contact plugs 5 touch and connect the first active layer 2 by means of the conductive contact holes, such that collected charges are stored by means of the conductive contact plugs 5. The conductive material may be polycrystalline silicon or tungsten, or of course, may be other materials with better conductivity, which are not to be listed one by one herein.

In an exemplary embodiment of the present disclosure, the conductive contact plugs 5 may be formed in the conductive contact holes by means of atomic layer deposition, vacuum evaporation, magnetron sputtering, chemical vapor deposition, or physical vapor deposition. Of course, the conductive contact plugs 5 may also be formed in other ways. The formation manner of the conductive contact plugs 5 is not particularly limited herein.

As shown in FIG. 1, in Step S150, a gate dielectric layer is formed on a side of the first active layer, a side of the first bit line, and a side of the conductive contact plug facing away from the substrate, respectively.

A gate dielectric layer 6 may be formed on a side of the first active layer 2, a side of the first bit line 4, and a side of the conductive contact plug 5 distant from the substrate 1, where the gate dielectric layer 6 may be a thin film formed on the side of the first active layer 2, the side of the first bit line 4, and the side of the conductive contact plug 5 distant from the substrate 1, and may be a coating formed on the side of the first active layer 2, the side of the first bit line 4, and the side of the conductive contact plug 5 distant from the substrate 1, which are not to be particularly limited herein.

In one embodiment, the gate dielectric layer 6 may be formed on the side of the first active layer 2, the side of the first bit line 4, and the side of the conductive contact plug 5 distant from the substrate 1 by means of chemical vapor deposition, thermal oxidation, physical vapor deposition, atomic layer deposition, or in-situ steam generation. Of course, the gate dielectric layer 6 may also be formed in other ways, which is not particularly limited here.

A material of the gate dielectric layer 6 may be an insulating material. For example, the material may be silicon dioxide, a high-k dielectric material, or other dielectric materials, or any combination thereof. A thickness of the gate dielectric layer 6 may be set according to actual requirements. For example, the thickness may be 2 nm to 5 nm, e.g., 2 nm, 3 nm, 4 nm, or 5 nm. Of course, the gate dielectric layer 6 may also have other thicknesses, which are not to be listed one by one herein.

In an exemplary embodiment of the present disclosure, the gate dielectric layer 6 may be formed on a surface of a structure jointly constituted by the conductive contact plug 5 and the third insulating layer 501. The second dielectric layer may be deposited on the surface of the structure jointly constituted by the conductive contact plug 5 and the third insulating layer 501 by means of chemical vapor deposition, physical vapor deposition, atomic layer deposition, thermal oxidation, or in-situ steam generation. A material of the second dielectric layer may be the same as that of the first dielectric layer 301. Therefore, reference may be made to the material of the first dielectric layer 301 for the material of the second dielectric layer, which is not to be described again herein. The second dielectric layer may be defined as the gate dielectric layer 6.

As shown in FIG. 1, in Step S160, a second active layer is formed on a side of the gate dielectric layer away from the substrate.

As shown in FIG. 16, the second active layer 7 may be a thin film formed on the surface of the gate dielectric layer 6, or may be a coating formed on the surface of the gate dielectric layer 6, which is not particularly limited herein. In one embodiment, the second active layer 7 may be formed on the surface of the gate dielectric layer 6 by means of chemical vapor deposition, physical vapor deposition, atomic layer deposition, thermal evaporation, vacuum evaporation, or magnetron sputtering, etc. Of course, the second active layer 7 may also be formed in other ways, which is not particularly limited herein.

In one embodiment, a material of the second active layer 7 may be the same as that of the first active layer 2, which is not to be described again herein. A thickness of the second active layer 7 may be set according to actual requirements. For example, the thickness of the second active layer 7 may be 5 nm to 20 nm, e.g., 5 nm, 10 nm, 15 nm, or 20 nm. Of course, the second active layer 7 may also have other thicknesses, which are not to be listed one by one herein.

As shown in FIG. 1, in Step S170, a second bit line and a second word line are formed on a side of the second active layer facing away from the substrate, where the second bit line and the second word line touch and connect the second active layer, respectively.

Both the second bit line and the second word line may be formed on the surface of the second active layer 7, and may touch and connect the second active layer 7. Details of the second bit line and the second word line are described in detail below in two embodiments.

In a first embodiment of the present disclosure, as shown in FIG. 17, the second bit line 8 may be made of a conductive material such as titanium nitride. The second word line 9 may also be made of a conductive material such as tungsten.

The second bit line 8 and the second word line 9 may be positioned on two sides of the conductive contact plug 5 respectively, and the second bit line 8 and the second word line 9 may touch and connect the second active layer 7, respectively. The second bit line 8 and the second word line 9 may be used as a source and a drain respectively, and jointly constitute a planar transistor with the conductive contact plug 5, where the transistor may be used as a read transistor of the DRAM to read data. A parasitic capacitor of the read transistor may be used as a memory cell to complete charge storage. The second bit line 8 and the second word line 9 may be separated by an insulating material to avoid coupling or short circuit between the structures.

The second bit lines 8 may be strip-shaped and may extend along the first direction x. There may be a plurality of second bit lines 8, the plurality of second bit lines 8 may be arranged at intervals along the second direction y, and an orthographic projection of each second bit line 8 on the substrate 1 is at least partially overlapped with an orthographic projection of the active area 201 on the substrate 1.

The second word lines 9 may also be strip-shaped and may extend along the first direction x. There may be a plurality of second word lines 9, the plurality of second word lines 9 may be arranged at intervals along the second direction y, and an orthographic projection of each second word line 9 on the substrate 1 is not overlapped with the orthographic projection of the active area 201 on the substrate 1.

For example, two second bit lines 8 may be arranged above each active area 201, the two second bit lines 8 may be arranged in parallel, and orthographic projections of the two second bit lines 8 on the substrate 1 may penetrate through orthographic projections of the plurality of active areas 201 arranged at intervals along the first direction x on the substrate 1. Meanwhile, in the second direction y, one second word line 9 may be respectively arranged on two sides of each active area 201, the two second word lines 9 may be arranged in parallel, and the two second word lines 9 may also be parallel to the two second bit lines 8. That is, the second bit lines 8 and the second word lines 9 arranged around any one active area 201 may extend along the first direction x, and the second word lines 9 and the second bit lines 8 may be arranged at intervals along the second direction y.

In the first embodiment of the present disclosure, forming the second bit line 8 and the second word line 9 may include Steps S610-S630, as shown in FIG. 19, In Step S610, a fourth insulating layer is formed on a side of the second active layer facing away from the substrate.

A fourth insulating layer 801 may be formed on the surface of the second active layer 7, where a material of the fourth insulating layer 801 may be the same as that of the first insulating layer 101, for example, silicon oxide. The fourth insulating layer 801 may be formed on the surface of the second active layer 7 by means of chemical vapor deposition, physical vapor deposition, or atomic layer deposition. Of course, the fourth insulating layer 801 may also be formed by means of other processes. The formation manner of the fourth insulating layer 801 is not particularly limited herein.

In Step S620, the fourth insulating layer is etched using the second active layer as an etching stop layer to form, in the fourth insulating layer, a plurality of second bit line trenches arranged at intervals and extending along the first direction and a plurality of second word line trenches arranged at intervals and extending along the first direction. An orthographic projection of each of the plurality of second bit line trenches on the substrate is overlapped with an orthographic projection of each of the plurality of active areas on the substrate, and an orthographic projection of each of the plurality of second word line trenches on the substrate is not overlapped with the orthographic projection of each of the plurality of active areas on the substrate.

A photoresist layer may be formed on a surface of the second insulating layer 801 by means of spin coating or by other means, where a material of the photoresist layer may be positive photoresist or negative photoresist, which is not limited herein.

The photoresist layer may be exposed by means of a mask, where a pattern of the mask may be matched to a desired pattern of the second bit line trench and a desired pattern of the second word line trench. Subsequently, the exposed photoresist layer may be developed to form a plurality of developing regions, where each of the developing regions may expose the fourth insulating layer 801, a pattern of each developing region may be the same as a desired pattern of the second bit line trench and a desired pattern of the second word line trench, and a size of each developing region may be matched with a desired size of the second bit line trench and a desired size of the second word line trench.

The fourth insulating layer 801 may be etched in the developing region by means of an anisotropic etching process, such that the second bit line trench and the second word line trench are formed in the fourth insulating layer 801. After the above etching process is completed, the photoresist layer may be removed by cleaning with a cleaning solution or by means of ashing or other processes.

It should be noted that the second bit line trenches may be strip-shaped and may extend along the first direction x. There may be a plurality of second bit line trenches, the plurality of second bit line trenches may be arranged at intervals along the second directions y, and an orthographic projection of each second bit line trench on the substrate 1 is at least partially overlapped with the orthographic projection of the active area 201 on the substrate 1.

The second word line trenches may also be strip-shaped and may extend along the first direction x. There may be a plurality of second word line trenches, the plurality of second word line trenches may be arranged at intervals along the second directions y, and an orthographic projection of each second word line trench on the substrate 1 is not overlapped with the orthographic projection of the active area 201 on the substrate 1.

In Step S630, a second bit line is formed in each of the second bit line trenches, and a second word line is formed in each of the second word line trenches.

In this embodiment of the present disclosure, the second bit line 8 may be formed in the second bit line trench first, and then the second word line 9 may be formed in the second word line trench. During the process of forming the second bit line 8, the second word line trench may be shielded such that the second bit line 8 is only formed in the second bit line trench. For convenience of processes, a conductive material may be filled in the second word line trench simultaneously, and then the conductive material in the second word line trench is removed by means of etching or other processes, to subsequently form the second word line 9 in the second word line trench. The second word line 9 may also be formed in the second word line trench first, and then the second bit line 8 is formed in the second bit line trench. Order of forming the second bit line 8 and the second word line 9 is not particularly limited herein. If the second word line 9 is formed before the second bit line 8, the second bit line trench may be shielded during the process of forming the second word line 9, such that the second bit line 9 is formed only in the second word line trench. For convenience of the processes, a conductive material is filled into the second bit line trench simultaneously, and then the conductive material in the second bit line trench is removed by means of etching or other processes, to subsequently form the second bit line 8 in the second bit line trench.

A formation process of the second bit line 8 and the second word line 9 will be described in detail below by taking an example where the second bit line 8 is formed before the second word line 9.

A first conductive material may be filled into the second bit line trench by means of atomic layer deposition, chemical vapor deposition, physical vapor deposition, vacuum evaporation, or magnetron sputtering, and then the second bit line 8 is formed in the second bit line trench. The first conductive material may be titanium nitride, and of course, may also be other materials with better electrical conductivity, which are not to be listed one by one herein.

It should be noted that for convenience of processes, in the process of forming the second bit line 8, a first conductive material may be simultaneously deposited on a surface of a structure jointly constituted by the second bit line trench, the second word line trench and the fourth insulating layer 801 until the first conductive material fills up each second bit line trench, then the deposition is stopped. Subsequently, the first conductive material in an area outside the second bit line trench may be removed, and the surface of the first conductive material in the second bit line trench is flush with the surface of the fourth insulating layer 801, and then the second bit line 8 is formed in the second bit line trench.

A second conductive material may be filled into the second word line trench by means of atomic layer deposition, chemical vapor deposition, physical vapor deposition, vacuum evaporation, or magnetron sputtering, and then the second word line 9 is formed in the second word line trench. The second conductive material may be tungsten, or of course, may also be other materials with better electrical conductivity, which are not to be listed one by one herein.

It should be noted that for convenience of processes, in the process of forming the second word line 9, the second conductive material may be simultaneously deposited on a surface of a structure jointly constituted by the second word line trench, the second bit line 8 and the fourth insulating layer 801 until the second conductive material fills up each second word line trench, and then the deposition is stopped. Subsequently, the second conductive material in an area outside the second word line trench may be removed, and the surface of the second conductive material in the second word line trench is flush with the surface of the fourth insulating layer 801, and then the second word line 9 is formed in the second word line trench. Each second word line 9 and each second bit line 8 may be isolated by the fourth insulating layer 801 to avoid coupling or short circuit between adjacent second bit lines 8, between adjacent second word lines 9, and between the second word lines 9 and the second bit lines 8 adjacent to each other, such that the product yield may be improved.

The process of first forming the second word line 9 and then forming the second bit line 8 is similar to the process of first forming the second bit line 8 and then forming the second word line 9, and thus detailed descriptions thereof are omitted here.

In a second embodiment of the present disclosure, arrangement and details of the second bit line 8 are the same as those of the second bit line 8 in the above first embodiment. Therefore, reference may be made to the first embodiment for the details, which are not described again herein.

The second embodiment of the present disclosure differs from the first embodiment in the arrangement of the second word line 9. The details of the second word line 9 in the second embodiment of the present disclosure are as follows.

Figure 20:
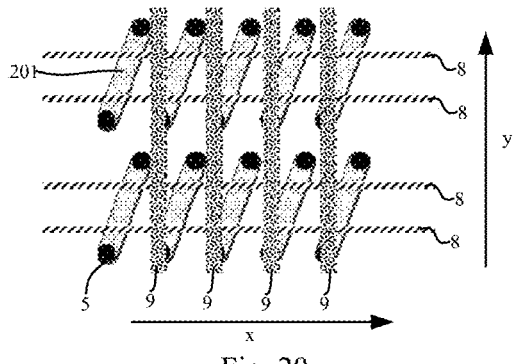
FIG. 20 is a schematic diagram of a second word line according to a second embodiment of the present disclosure.
Figure 21:
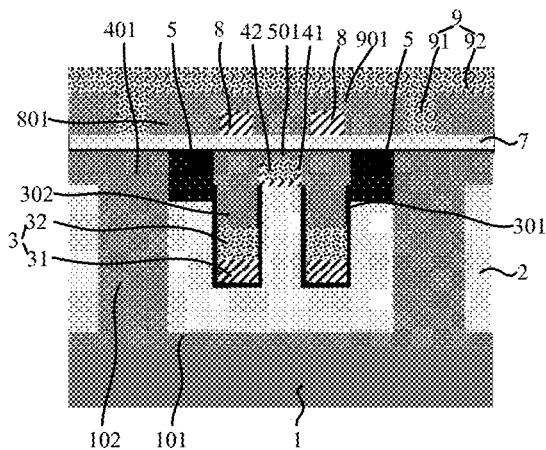
FIG. 21 is a schematic diagram after completing Step S170 according to a second embodiment of the present disclosure.

The second word line 9 may be made of a conductive material such as tungsten. As shown in FIG. 20 and FIG. 21, each second word line 9 may include a first conductive structure 91 and a second conductive structure 92. The first conductive structure 91 may be strip-shaped and may extend along the second direction y. The second conductive structure 92 may include a plurality of conductive plugs arranged at intervals, and the cross section of the second conductive structure 92 in a direction parallel to the substrate 1 may be circular, oval, rectangular, or irregular. The shapes of the conductive plugs are not particularly limited herein. One end of each conductive plug may contact and connect the second active layer 7, and the other end of each conductive plug may contact and connect the first conductive structure 91.

In one embodiment, an orthographic projection of each conductive plug on the substrate 1 is not overlapped with the orthographic projection of the active area 201 on the substrate 1. For example, around any one active area 201, the orthographic projection of each conductive plug on the substrate 1 may be positioned on a side of the orthographic projection of the conductive contact plug 5 on the substrate 1 distant from the orthographic projection of the second bit line 8 on the substrate 1, and the orthographic projection of the conductive plug on the substrate 1 may be within the orthographic projection of the isolation structure 102 on the substrate 1.

There may be a plurality of second word lines 9, the first conductive structures 91 of the second word lines 9 may be arranged at intervals along the first direction x. The second word lines 9 may touch and connect the second active layer 7. For example, the conductive plugs of the second word lines 9 touch and connect the second active layer 7.

Figure 22:
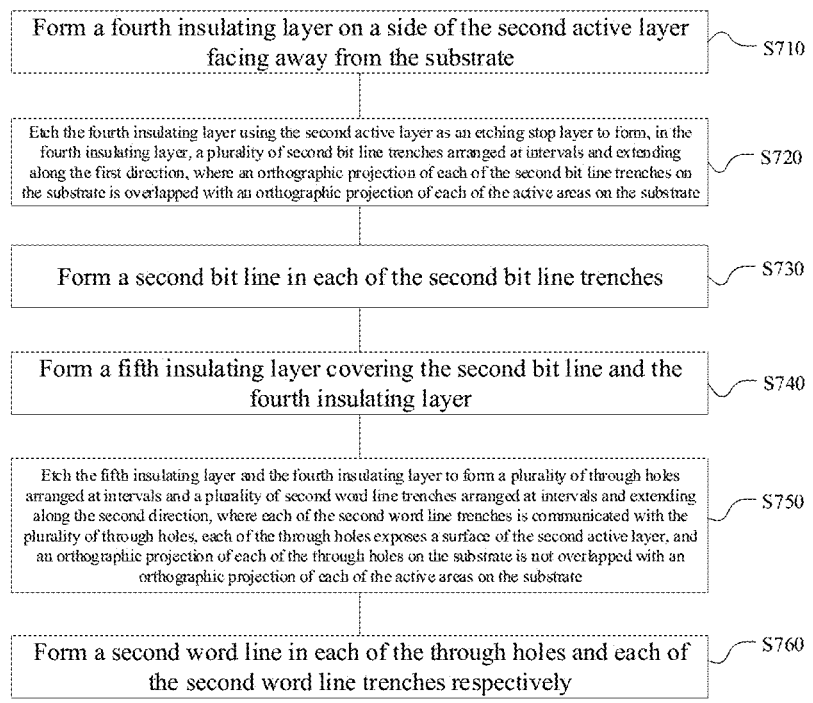
FIG. 22 is a flowchart of Step S170 according to a second embodiment of the present disclosure.

In the second embodiment of the present disclosure, forming the second bit line 8 and the second word line 9 may include Steps S710-S760, as shown in FIG. 22.

In Step S710, a fourth insulating layer is formed on a side of the second active layer facing away from the substrate.

In Step S720, the fourth insulating layer is etched using the second active layer as an etching stop layer to form, in the fourth insulating layer, a plurality of second bit line trenches arranged at intervals and extending along the first direction, where an orthographic projection of each of the plurality of second bit line trenches on the substrate is overlapped with an orthographic projection of each of the plurality of active areas on the substrate.

In Step S730, a second bit line is formed in each of the plurality of second bit line trenches, respectively.

The formation manner of the second bit line 8 in the second embodiment of the present disclosure is similar to the formation manner of the second bit line 8 in the first embodiment of the present disclosure, and thus detailed descriptions thereof are omitted here.

In Step S740, a fifth insulating layer covering the second bit line and the fourth insulating layer is formed.

A fifth insulating layer 901 may be formed on a surface of a structure jointly constituted by the second bit line 8 and the fourth insulating layer 801. A material of the fifth insulating layer 901 may be the same as that of the first insulating layer 101, for example, silicon oxide. The fifth insulating layer 901 may be formed on the surface of the structure jointly constituted by the second line 8 and the fourth insulating layer 801 by means of chemical vapor deposition, physical vapor deposition, or atomic layer deposition. Of course, the fifth insulating layer 901 may also be formed in other ways. A formation manner of the fifth insulating layer 901 is not particularly limited herein.

In Step S750, the fifth insulating layer and the fourth insulating layer are etched to form a plurality of through holes arranged at intervals and a plurality of second word line trenches arranged at intervals and extending along the second direction, where each of the plurality of second word line trenches is communicated with the plurality of through holes, each of the plurality of through holes exposes a surface of the second active layer, and an orthographic projection of each of the plurality of through holes on the substrate is not overlapped with an orthographic projection of each of the plurality of active areas on the substrate.

The through holes may be configured to form the second conductive structures 92, each through hole may expose the surface of the second active layer 7, and an orthographic projection of each through hole on the substrate 1 is not overlapped with the orthographic projection of the active area 201 on the substrate 1. The second word line trenches may be configured to form the first conductive structures 91, and each second word line trench may be communicated with a plurality of through holes, such that the first conductive structures 91 formed in the second word line trenches touch and connect the second conductive structures 92 subsequently formed in the through holes.

In one embodiment, a photoresist layer may be formed on the surface of the fifth insulating layer 901 by means of spin coating or by other means, where a material of the photoresist layer may be positive photoresist or negative photoresist, which is not particularly limited herein. The photoresist layer may be exposed by means of a first mask, and a pattern of the first mask may be matched with a desired pattern of each through hole. Subsequently, the exposed photoresist layer may be developed to form a plurality of first developing regions, each of the first developing regions may expose the fifth insulating layer 901, a pattern of each first developing region may be the same as a desired pattern of each through hole, and a size of each first developing region may be matched with a desired size of each through hole. The fifth insulating layer 901 and the fourth insulating layer 801 may be etched in the first developing regions using the second active layer 7 as an etching stop layer by means of an anisotropic etching process, such that a plurality of through holes arranged at intervals are formed in the fifth insulating layer 901 and the fourth insulating layer 801.

Subsequently, the photoresist layer may be exposed by means of a second mask, where a pattern of the second mask may be matched to a desired pattern of the second word line trench. Subsequently, the exposed photoresist layer may be developed to form a plurality of second developing regions, where each of the second developing regions may expose the fifth insulating layer 901, a pattern of each second developing region may be the same as a desired pattern of the second word line trench, and a size of each second developing region may be matched with a desired size of the second word line trench. The fifth insulating layer 901 and the fourth insulating layer 801 may be etched in the second developing region by means of an anisotropic etching process, such that a plurality of second word line trenches arranged at intervals are formed in the fifth insulating layer 901 and the fourth insulating layer 801.

It should be noted that the second word line trenches may be strip-shaped and may extend along the second direction y. There may be a plurality of second word line trenches, and the plurality of second word line trenches may be arranged at intervals along the first direction x.

In Step S760, a second word line is formed in each of the through holes and each of the second word line trenches, respectively.

The second conductive material may be filled into each of the through holes and each of the second word line trenches by means of atomic layer deposition, chemical vapor deposition, physical vapor deposition, vacuum evaporation, or magnetron sputtering, and then the second word line 9 is formed in each of the through holes and each of the second word line trenches. The second conductive material may be tungsten, or of course, may also be other materials with better electrical conductivity, which are not to be listed one by one herein.

It should be noted that for convenience of processes, in the process of forming the second word line 9, the second conductive material may be simultaneously deposited on a surface of a structure jointly constituted by the through hole, the second word line trench and the fifth insulating layer 901 until the second conductive material fills up each through hole and each second word line trench, and then the deposition is stopped. Subsequently, the second conductive material on the surface of the fifth insulating layer 901 may be removed, and the surface of the second conductive material in the second word line trench is flush with the surface of the fifth insulating layer 901, and then the second word line 9 is formed in the through hole and the second word line trench. Each second word line 9 and each second bit line 8 may be isolated by the fourth insulating layer 801 and the fifth insulating layer 901 to avoid coupling or short circuit between adjacent second bit lines 8, between adjacent second word lines 9, and between the second word lines 9 and the second bit lines 8 adjacent to each other, such that the product yield may be improved.

It is to be noted that steps of the method for forming a semiconductor structure in the present disclosure are described in a particular order in the accompanying drawings. However, this does not require or imply to execute these steps necessarily according to the particular order, or this does not mean that the expected result cannot be implemented unless all the shown steps are executed. Additionally, some steps may be omitted, a plurality of steps may be combined into one step for execution, and/or one step may be decomposed into a plurality of steps for execution.

The present disclosure also provides a semiconductor structure, as shown in FIG. 18 and FIG. 21, the semiconductor structure may include a substrate 1, a first active layer 2, a first word line structure, a first bit line structure, a conductive contact structure, a gate dielectric layer 6, a second active layer 7, a second word line structure, and a second bit line structure.

The first active layer 2 is positioned on a side of the substrate 1, and includes a plurality of active areas 201 distributed at intervals.

The first word line structure includes a plurality of first word lines 3 distributed at intervals, where each of the first word lines 3 extends along the first direction x, and each of the first word lines 3 passes through a plurality of active areas 201.

The first bit line structure includes a plurality of first bit lines 4 distributed at intervals, each of the first bit lines 4 extends along the second direction y, and each of the first bit lines 4 is connected to a first end of each of the plurality of active areas 201, where the first direction x intersects the second direction y.

The conductive contact structure includes a plurality of conductive contact plugs 5, each conductive contact plug 5 is connected to a second end of one active area 201, and the first end and the second end are respectively positioned on two sides of the first word line 3.

The gate dielectric layer 6 is positioned on a side of the first active layer 2, a side of the first bit line, and a side of the conductive contact structure facing away from the substrate 1.

The second active layer 7 is positioned on the side of the gate dielectric layer 6 facing away from the substrate 1.

The second word line structure is positioned on the side of the second active layer 7 facing away from the substrate 1, and includes a plurality of second word lines 9, where each of the second word lines 9 is connected to a first region of the second active layer 7.

The second bit line structure is positioned on the side of the second active layer 7 facing away from the substrate 1, and includes a plurality of second bit lines 8, where each of the second bit lines 8 is connected to a second region of the second active layer 7.

An orthographic projection of each conductive contact structure on the second active layer 7 is positioned between the first region and the second region.

In the semiconductor structure provided by the present disclosure, the first bit line 4 and the conductive contact plug 5 may be used as a source and a drain respectively, and jointly constitute a $6F^2$ buried transistor with the first word line 3, which may improve integration of a device, where the transistor may be used as a write transistor of a DRAM to control data writing. Moreover, the second bit line 8 and the second word line 9 may be used as a source and a drain respectively, and jointly constitute a planar transistor with the conductive contact plug 5, where this transistor may be used as a read transistor of the DRAM to read data. A parasitic capacitor of the read transistor may be used as a memory cell to complete charge storage. Moreover, the integration of the device may be improved by combining the planar transistor with a $6F^2$ DRAM architecture, which facilitates integrated design. In this process, in one aspect, because charge retention time of the transistor is longer than that of a conventional capacitor, it is not necessary to refresh too frequently, and the power consumption of the device is lower. In another aspect, because a second active layer 7 is positioned between the gate dielectric layer 6 and the second word line 9, a physical size between the second word line 9 and the conductive contact plug 5 is increased, and an electric field between the drain and the gate is reduced, thereby reducing a leakage current of the drain. Moreover, due to the increase of the physical size, the gate dielectric layer 6 may be effectively prevented from breaking down, the standby power consumption may be effectively reduced, and reliability of the device is improved. In addition, because the read transistor and the write transistor share one electrode (the conductive contact plug 5), the gate of the read transistor and the drain of the write transistor are the same electrode, and charges in a gate capacitor of the read transistor may be changed by means of the write transistor, to complete data writing and reading.

Each part of the semiconductor structure in the embodiments of the present disclosure will be described in detail below.

As shown in FIG. 2, the substrate 1 may have a flat plate structure, which may be rectangular, circular, elliptical, polygonal or irregular in shape, and a material of the substrate 1 may be a semiconductor material such as silicon, but not limited to silicon or other semiconductor materials. Neither the shape nor the material of the substrate 1 are specially limited here.

The first active layer 2 may be formed on a side of the substrate 1, and may include a plurality of active areas 201 arranged at intervals, where the plurality of active areas 201 may be arranged at intervals in rows and/or columns. For example, a cross section of each active area 201 may be in a waist circle or a rectangle, and of course, other shapes are also acceptable. Neither the shape nor the cross section of the active area 201 is particularly limited herein.

A material of the first active layer 2 may be an amorphous material, for example, indium gallium zinc oxide (IGZO), indium gallium zinc tin oxide (IGZTO), indium tin oxide (ITO), and indium titanium oxide (ITO), etc. In some embodiments, the material of the first active layer 2 may be indium gallium zinc oxide (IGZO).

In one embodiment, the first active layer 2 has a plurality of first word line trenches 303. For example, each active area 201 may have two first word line trenches 303 arranged at intervals, where the two first word line trenches 303 may be arranged in parallel, and the two first word line trenches 303 in adjacent two active areas 201 may be communicated with each other.

In an exemplary embodiment of the present disclosure, the semiconductor structure of the present disclosure may further include a first insulating layer 101 and an isolation structure 102.

The first insulating layer 101 may be positioned between the substrate 1 and the first active layer 2. For example, the first insulating layer 101 may be positioned between the substrate 1 and the active area 201. For example, the first insulating layer 101 may be positioned on the surface of the substrate 1, the substrate 1 may be separated from the first active layer 2 by means of the first insulating layer 101 to prevent impurities in the substrate 1 from diffusing into the first active layer 2, which is advantageous to ensuring stability of a device.

The first insulating layer 101 may be a thin film formed on the surface of the substrate 1 or may be a coating formed on the surface of the substrate 1, which is not particularly limited herein. A material of the first insulating layer 101 may be an insulating material, for example, silicon dioxide, a high-k dielectric material or other dielectric materials, or any combination thereof. A thickness of the first insulating layer 101 may be set according to actual needs.

The isolation structure 102 may be positioned between a plurality of active areas 201, that is, the isolation structure 102 may be positioned between two adjacent active areas 201 in the second active layer 7. The isolation structure 102 may be formed of an insulating material, for example, silicon nitride, silicon oxide or a combination thereof, which is not particularly limited here. A shape of a cross section of the isolation structure 102 may be set according to actual requirements. Adjacent active areas 201 may be insulated and isolated by the isolation structure 102 to avoid coupling or short circuit between structures in the adjacent active areas 201.

As shown in FIG. 7, the first word line structure may include a plurality of first word lines 3 arranged at intervals, where each first word line 3 may penetrate through a plurality of active areas 201. The first word lines 3 may extend along the first direction x, and may be arranged at intervals along the second direction y. In the first direction x, two ends of each first word line 3 may be penetrable and may be in a strip shape, and the first word lines 3 in the strip shape may be arranged in parallel.

It should be noted that the first direction x may be any one of lateral extension directions of the substrate 1, and the first direction x is not particularly limited herein. The second direction y may intersect the first direction x, e.g., the first direction x may be perpendicular to the second direction y. It is to be noted that the perpendicular may be absolutely perpendicular or approximately perpendicular, this is because deviations are unavoidable in manufacturing processes. In the present disclosure, deviation of an angle may be caused by limitations of fabrication technologies, such that there is a certain deviation of an angle between the first direction x and the second direction y. However, it may be considered that the first direction x is perpendicular to the second direction y as long as the deviation of the angle between the first direction x and the second direction y is within a preset range. For example, the preset range may be 10°. That is, when the angle between the first direction x and the second direction y is within a range of greater than or equal to 80° and less than or equal to 100°, it may be considered that the first direction x is perpendicular to the second direction y.

For example, the first word lines 3 may be formed in the first word line trenches 303 in one-to-one correspondence. When each active area 201 has two first word line trenches 303 arranged at intervals, two first word lines 3 arranged at intervals may be formed in each active area 201, and the two first word lines 3 may be arranged in parallel. The two first word lines 3 in adjacent two active areas 201 may be communicated with each other.

In an exemplary embodiment of the present disclosure, the first word line 3 may include a first dielectric layer 301 and a conductive layer. As shown in FIG. 6, the first dielectric layer 301 may be positioned between the conductive layer and the active area 201, where a top surface of the conductive layer is lower than that of the active area 201. The first dielectric layer 301 may be a thin film formed on the side wall and the bottom of the first word line trench 303, or may also be a coating formed on the side wall and the bottom of the first word line trench 303, which is not particularly limited herein. The first dielectric layer 301 may be made of an insulating material such as silicon oxide.

In one embodiment, a thickness of the first dielectric layer 301 may be 2 nm to 5 nm. For example, the thickness of the first dielectric layer 301 may be 2 nm, 3 nm, 4 nm, or 5 nm. Of course, the first dielectric layer 301 may also have other thicknesses, which are not to be listed one by one herein.

A conductive layer may be formed in each first word line trench 303 after the first dielectric layer 301 is formed. As shown in FIG. 8, the conductive layer may include a first conductive layer 31 and a second conductive layer 32, where the first conductive layer 31 and the second conductive layer 32 may be sequentially formed in the first word line trench 303.

For example, the first conductive layer 31 may be a thin film formed at the bottom of the first word line trench 303, and the material thereof may be titanium nitride. The first conductive layer 31 may conformally contact the first dielectric layer 301 on the side wall and the bottom of the first word line trench 303, and the surface of the first conductive layer 31 facing away from the substrate 1 may be lower than the top surface of the first word line trench 303.

The second conductive layer 32 may be a thin film formed on a side of the first conductive layer 31 facing away from the substrate 1, and the material thereof may be tungsten. The second conductive layer 32 may touch and connect the first conductive layer 31, and the surface of the second conductive layer 32 facing away from the first conductive layer 31 may be lower than the top surface of the first word line trenches 303.

In an exemplary embodiment of the present disclosure, each first word line 3 may further include a passivation layer 302. The passivation layer 302 may be a thin film formed on a side of the second conductive layer 32 facing away from the first conductive layer 31, and may be configured to protect the surface of the second conductive layer 32, where a material of the passivation layer 302 may be silicon oxide or silicon nitride. It should be noted that a surface of the passivation layer 302 facing away from the second conductive layer 32 may be flush with the surface of the first active layer 2.

A second insulating layer 401 may be formed on a surface of a structure jointly constituted by the first word line 3 and the first active layer 2, where the orthographic projection of the first word line 3 on the substrate 1 and the orthographic projection of the first active layer 2 on the substrate 1 may be within an orthographic projection of the second insulating layer 401 on the substrate 1. For example, the second insulating layer 401 may cover the surface of the first active layer 2 on two sides of the first word line trench 303 and the surface of the passivation layer 302.

In an exemplary embodiment of the present disclosure, a material of the second insulating layer 401 may be the same as that of the first insulating layer 101, for example, silicon oxide. The second insulating layer 401 may have a plurality of first bit line trenches arranged at intervals, where each of the plurality of first bit line trenches may extend along the second direction y, and the plurality of first bit line trenches may be arranged at intervals along the first direction x.

The first bit line trenches may penetrate through the plurality of active areas 201, and an orthographic projection of a first end of each active area 201 on the substrate 1 is at least partially overlapped with an orthographic projection of each first bit line trench on the substrate 1. In one embodiment, the first bit line trench may penetrate through the second insulating layer 401, and may expose the top of the first active layer 2 at the first end of each active area 201 below the second insulating layer 401.

The first bit line 4 may be positioned in the first bit line trench and may include a third conductive layer 41 and a fourth conductive layer 42. The third conductive layer 41 may be conformally attached to the bottom and the side wall of the first bit line trench, and may contact and connect the first active layer 2 at the bottom of the first bit line trench. The fourth conductive layer 42 may fill up the first bit line trench where the third conductive layer 41 is formed, and may be flush with the top surface of the second insulating layer 401. Both a material of the third conductive layer 41 and a material of the fourth conductive layer 42 may be conductive materials. For example, the material of the third conductive layer 41 may be titanium nitride, and the material of the fourth conductive layer 42 may be tungsten.

In an exemplary embodiment of the present disclosure, as shown in FIG. 10, after the first bit line 4 is formed, a third insulating layer 501 may be formed on a surface of a structure jointly constituted by the first bit line 4 and the second insulating layer 401. A material of the third insulating layer 501 may be the same as that of the first insulating layer 101, for example, silicon oxide.

The semiconductor structure of the present disclosure may further include a plurality of conductive contact holes penetrating through the second insulating layer 401 and the third insulating layer 501, and the plurality of conductive contact holes may be arranged at intervals. The conductive contact holes may be circular holes, rectangular holes, or hole-like structures in an irregular shape, which is not particularly limited herein.

The plurality of conductive contact holes may be arranged in a column and may be arranged at intervals along an extension direction of the first bit line 4. In one embodiment, each first bit line 4 may form a group with each column of conductive contact holes, multiple groups of first bit lines 4 and conductive contact holes may be formed side by side, and columns constituted by the first bit lines 4 and the conductive contact holes in adjacent two groups are alternately arranged. That is, the conductive contact holes are arranged on two sides of the first bit line 4 and may be arranged at intervals along the extension direction of the first bit line 4.

Each conductive contact hole may expose the first active layer 2 at the second end of the active area 201. It should be noted that the first end and the second end of the active area 201 may be positioned on two sides of the first word line 3, respectively. When the active area 201 includes two word lines, the active area 201 between the two word lines may be defined as the first end of the active area 201, and the active area 201 of one word line distant from a side of the other word line may be defined as the second end of the active area 201.

A conductive contact structure may be formed in the conductive contact hole, and may touch and connect the first active layer 2 by means of the conductive contact hole, to store the collected charges by means of the conductive contact plug 5. A material of the conductive contact plug 5 may be polycrystalline silicon or tungsten, or of course, may be other materials with better conductivity, which are not to be listed one by one herein.

For example, each conductive contact hole may form one conductive contact plug 5 in one-to-one correspondence, such that a plurality of conductive contact plugs 5 arranged at intervals may be formed, where each conductive contact plug 5 may be connected to the second end of one active area 201.

The gate dielectric layer 6 may be positioned on a side of the first active layer 2, a side of a first bit structure, and a side of a conductive contact structure distant from the substrate 1, where the gate dielectric layer 6 may be a thin film formed on the side of the first active layer 2, the side of the first bit structure, and the side of the conductive contact structure distant from the substrate 1, and may be a coating formed on the side of the first active layer 2, the side of the first bit structure, and the side of the conductive contact structure distant from the substrate 1, which is not particularly limited herein.

A material of the gate dielectric layer 6 may be an insulating material, for example, silicon dioxide, a high-k dielectric material or other dielectric materials, or any combination thereof. A thickness of the gate dielectric layer 6 may be set according to actual requirements. For example, the thickness of the gate dielectric layer 6 may be 2 nm to 5 nm, e.g., 2 nm, 3 nm, 4 nm, or 5 nm. Of course, the gate dielectric layer 6 may also have other thicknesses, which are not to be listed one by one herein.

In an exemplary embodiment of the present disclosure, the gate dielectric layer 6 may be positioned on a surface of a structure jointly constituted by the conductive contact structure and the third insulating layer 501. That is, the conductive contact structure may touch and connect the surface of the gate dielectric layer 6, and the first bit line structure is spaced apart from the surface of the gate dielectric layer 6.

The second active layer 7 may be positioned on a side of the gate dielectric layer 6 facing away from the substrate 1. For example, the second active layer 7 may be a thin film formed on the surface of the gate dielectric layer 6, or may be a coating formed on the surface of the gate dielectric layer 6, which is not particularly limited herein.

In one embodiment, a material of the second active layer 7 may be amorphous silicon, for example, indium gallium zinc oxide (IGZO), indium gallium zinc tin oxide (IGZTO), indium tin oxide (ITO), and indium titanium oxide (ITO), etc. In some embodiments, the material of the second active layer 7 may be IGZO. A thickness of the second active layer 7 may be set according to actual requirements. For example, the thickness of the second active layer 7 may be 5 nm to 20 nm, e.g., 5 nm, 10 nm, 15 nm, or 20 nm. Of course, the second active layer 7 may also have other thicknesses, which are not to be listed one by one herein.

The second active layer 7 may include a plurality of first regions arranged side by side and a plurality of second regions arranged side by side. The plurality of first regions and the plurality of second regions may also be arranged at intervals. Both the first region and the second region may be strip-shaped regions.

In the first embodiment of the present disclosure, the plurality of first regions and the plurality of second regions may extend along the first direction x and may be arranged at intervals along the second direction y. For example, two of the first regions and two of the second regions may be arranged around one active area 201. The two of the second regions may be positioned between two of the first regions, an orthographic projection of each second region on the substrate 1 is overlapped with the orthographic projection of the active area 201 on the substrate 1, and an orthographic projection of each first region on the substrate 1 is not overlapped with the orthographic projection of the active area 201 on the substrate 1. Furthermore, the orthographic projection of each conductive contact plug 5 on the second active layer 7 is positioned between the first region and the second region.

Both the second word line structure and the second bit line structure may be positioned on the side of the second active layer 7 facing away from the substrate 1. The second word line structure may include a plurality of second word lines 9, and the plurality of second word lines 9 may be connected to the first regions of the second active layers 7 in one-to-one correspondence. The second bit line structure may include a plurality of second bit lines 8, and the plurality of second bit lines 8 may be connected to the second regions of the second active layers 7 in one-to-one correspondence.

In the first embodiment of the present disclosure, the second bit line 8 may be made of a conductive material such as titanium nitride. The second word line 9 may also be made of a conductive material such as tungsten.

The second bit line 8 and the second word line 9 may be positioned on two sides of the conductive contact plug 5 respectively, and the second bit line 8 and the second word line 9 may touch and connect the second active layer 7, respectively. The second bit line 8 and the second word line 9 may be used as a source and a drain, respectively, and jointly constitute a planar transistor with the conductive contact plug 5, where the transistor may be used as a read transistor of the DRAM to read data. A parasitic capacitor of the read transistor may be used as a memory cell to complete charge storage. The second bit line 8 and the second word line 9 may be separated by an insulating material to avoid coupling or short circuit between the structures.

The second bit lines 8 may be strip-shaped and may extend along the first direction x. There may be a plurality of second bit lines 8, the plurality of second bit lines 8 may be arranged at intervals along the second direction y, and an orthographic projection of each second bit line 8 on the substrate 1 is at least partially overlapped with an orthographic projection of the active area 201 on the substrate 1.

The second word lines 9 may also be strip-shaped and may extend along the first direction x. There may be a plurality of second word lines 9, the plurality of second word lines 9 may be arranged at intervals along the second direction y, and an orthographic projection of each second word line 9 on the substrate 1 is not overlapped with the orthographic projection of the active area 201 on the substrate 1. That is, each second bit line 8 and each second word line 9 are arranged in parallel.

For example, two second bit lines 8 may be arranged above each active area 201, the two second bit lines 8 may be arranged in parallel, and orthographic projections of the two second bit lines 8 on the substrate 1 may penetrate through orthographic projections of the plurality of active areas 201 arranged at intervals along the first direction x on the substrate 1. Meanwhile, in the second direction y, one second word line 9 may be respectively arranged on two sides of each active area 201, the two second word lines 9 may be arranged in parallel, and the two second word lines 9 may also be parallel to the two second bit lines 8. That is, the second bit lines 8 and the second word lines 9 arranged around any one active area 201 may extend along the first direction x, and the second word lines 9 and the second bit lines 8 may be arranged at intervals along the second direction y.

In the second embodiment of the present disclosure, the first regions may extend along the second direction y and may be arranged at intervals along the first direction x; and the second regions may extend along the first direction x and may be arranged at intervals along the second direction y.

In this embodiment, arrangement and details of the second bit line 8 are the same as those of the second bit line 8 in the above first embodiment. Therefore, reference may be made to the first embodiment for the details, which are not described again herein.

The second embodiment of the present disclosure differs from the first embodiment in the arrangement of the second word line 9. The details of the second word line 9 in the second embodiment of the present disclosure are as follows.

The second word line 9 may be made of a conductive material such as tungsten. Each second word line 9 may include a first conductive structure 91 and a second conductive structure 92, where the first conductive structure 91 may be strip-shaped and may extend along the second direction y. the second conductive structure 92 may include a plurality of conductive plugs arranged at intervals, and cross sections of the second conductive structures 92 in a direction parallel to the substrate 1 may be circular, oval, rectangular, or irregular. Shapes of the conductive plugs are not particularly limited herein. One end of each conductive plug may touch and connect the second active layer 7, and the other end thereof may touch and connect the first conductive structure 91.

In one embodiment, an orthographic projection of each conductive plug on the substrate 1 is not overlapped with the orthographic projection of the active area 201 on the substrate 1. For example, around any one active area 201, the orthographic projection of each conductive plug on the substrate 1 may be positioned on a side of the orthographic projection of the conductive contact plug 5 on the substrate 1 distant from the orthographic projection of the second bit line 8 on the substrate 1, and the orthographic projection of the conductive plug on the substrate 1 may be within the orthographic projection of the isolation structure 102 on the substrate 1.

There may be a plurality of second word lines 9, the first conductive structures 91 of the second word lines 9 may be arranged at intervals along the first direction x. The second word lines 9 may touch and connect the second active layer 7. For example, the conductive plugs of the second word lines 9 touch and connect the second active layer 7.

An embodiment of the present disclosure further provides a memory, which may include the semiconductor structure in any one of the above embodiments, and its details, formation process and beneficial effects have been described in detail in the corresponding method for forming a semiconductor structure and the semiconductor structure, and thus detailed description of the memory is omitted here.

Figure 23:
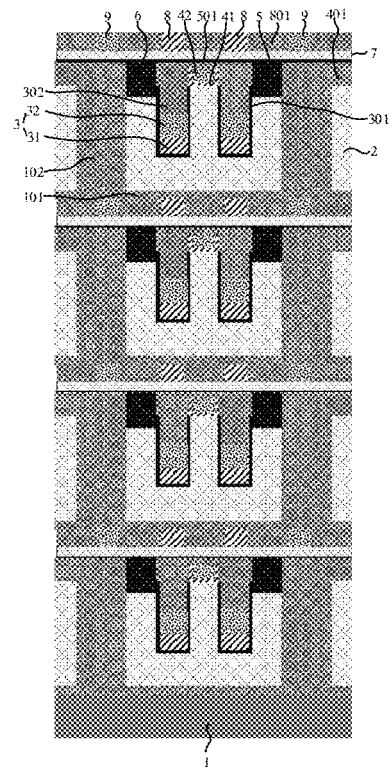
FIG. 23 is a schematic diagram of a memory according to a first embodiment of the present disclosure.
Figure 24:
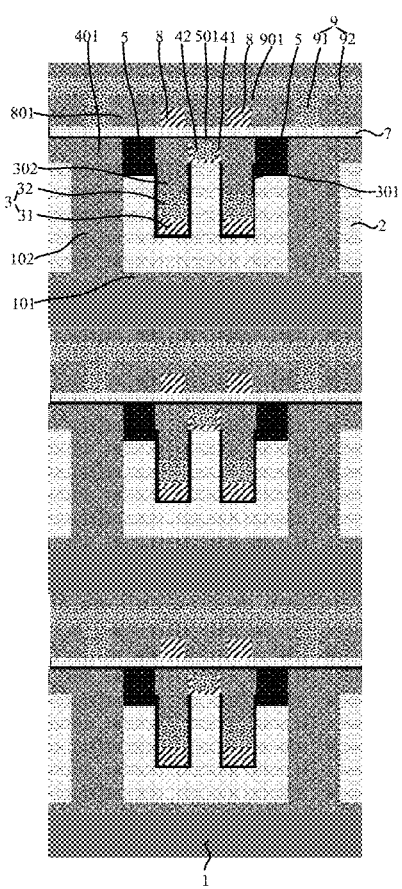
FIG. 24 is a schematic diagram of a memory according to a second embodiment of the present disclosure.

In one embodiment, as shown in FIG. 23 and FIG. 24, the memory may include a plurality of semiconductor structures in any one of the foregoing embodiments, and the semiconductor structures may be stacked and arranged along a direction perpendicular to the substrate 1.

In an exemplary embodiment of the present disclosure, the semiconductor structure close to a side of the substrate 1 may serve as the substrate 1 of the adjacent semiconductor structure distant from a side of the substrate 1.

For example, the memory may be a dynamic random access memory (DRAM), a static random access memory (SRAM) or the like. Of course, the memory may also be other storage apparatuses, which are not to be enumerated one by one here.

Other embodiments of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the appended claims.

What is claimed is:

1. A method for forming a semiconductor structure, comprising:
    providing a substrate;
    forming a first active layer on a side of the substrate, the first active layer comprising a plurality of active areas arranged at intervals;
    forming a first word line in each of the plurality of active areas;
    forming a first bit line and a conductive contact plug on a top of the first active layer, the first bit line, the conductive contact plug and the first word line being insulated from one another;
    forming a gate dielectric layer on a side of the first active layer, a side of the first bit line, and a side of the conductive contact plug facing away from the substrate, respectively;
    forming a second active layer on a side of the gate dielectric layer facing away from the substrate; and
    forming a second bit line and a second word line on a side of the second active layer facing away from the substrate, the second bit line and the second word line touching and connecting the second active layer, respectively.

2. The formation method according to claim 1, wherein the forming the first active layer on a side of the substrate comprises:
    forming a first insulating layer on the substrate;
    forming a semiconductor layer on the first insulating layer; and
    etching the semiconductor layer to form a plurality of isolation trenches arranged at intervals in the semiconductor layer, the plurality of isolation trenches dividing the semiconductor layer into the plurality of active areas.

3. The formation method according to claim 2, wherein the forming the first word line in each of the plurality of active areas comprises:
    forming a plurality of first word line trenches arranged at intervals and extending along a first direction, each of the plurality of first word line trenches passing through the plurality of active areas;
    forming a first dielectric layer on a side wall and a bottom of each of the plurality of first word line trenches; and
    filling a conductive material into a given one of the plurality of first word line trenches with the first dielectric layer formed, to form the first word line.

4. The formation method according to claim 3, wherein the forming the first bit line comprises:
    forming a second insulating layer, the second insulating layer covering a surface of the first active layer and a surface of the first word line;
    patterning the second insulating layer to form a plurality of first bit line trenches arranged at intervals and extending along a second direction, each of the plurality of first bit line trenches exposing a first end of a given one of the plurality of active areas, and the second direction intersecting with the first direction; and
    forming the first bit line in each of the plurality of first bit line trenches.

5. The formation method according to claim 4, wherein the forming the conductive contact plug comprises:
    forming a third insulating layer, the third insulating layer covering a surface of the first bit line and a surface of the second insulating layer;
    etching the second insulating layer and the third insulating layer to form a plurality of conductive contact holes, each of the plurality of conductive contact holes exposing a second end of the given active area, and the first end and the second end being positioned on two sides of the first word line, respectively; and
    forming the conductive contact plug in each of the plurality of conductive contact holes.

6. The formation method according to claim 5, wherein the forming the gate dielectric layer comprises:
    depositing a second dielectric layer on a surface of a structure jointly constituted by the conductive contact plug and the third insulating layer, to form the gate dielectric layer.

7. The formation method according to claim 3, wherein the forming the second bit line and the second word line comprises:
    forming a fourth insulating layer on a side of the second active layer facing away from the substrate;
    etching the fourth insulating layer using the second active layer as an etching stop layer to form, in the fourth insulating layer, a plurality of second bit line trenches arranged at intervals and extending along the first direction and a plurality of second word line trenches arranged at intervals and extending along the first direction, an orthographic projection of each of the plurality of second bit line trenches on the substrate being overlapped with an orthographic projection of each of the plurality of active areas on the substrate, and an orthographic projection of each of the plurality of second word line trenches on the substrate being not overlapped with the orthographic projection of each of the plurality of active areas on the substrate; and
    forming a second bit line in each of the plurality of second bit line trenches, and forming a second word line in each of the plurality of second word line trenches.

8. The formation method according to claim 3, wherein the forming the second bit line and the second word line comprises:
    forming a fourth insulating layer on a side of the second active layer facing away from the substrate;
    etching the fourth insulating layer using the second active layer as an etching stop layer to form, in the fourth insulating layer, a plurality of second bit line trenches arranged at intervals and extending along the first direction, an orthographic projection of each of the plurality of second bit line trenches on the substrate being overlapped with an orthographic projection of each of the plurality of active areas on the substrate;

forming a second bit line in each of the plurality of second bit line trenches;

forming a fifth insulating layer covering the second bit line and the fourth insulating layer;

etching the fifth insulating layer and the fourth insulating layer to form a plurality of through holes arranged at intervals and a plurality of second word line trenches arranged at intervals and extending along the second direction, each of the plurality of second word line trenches being communicated with the plurality of through holes, each of the plurality of through holes exposing a surface of the second active layer, and an orthographic projection of each of the plurality of through holes on the substrate being not overlapped with an orthographic projection of each of the plurality of active areas on the substrate; and forming a second word line in each of the plurality of through holes and each of the plurality of second word line trenches, respectively.

9. A semiconductor structure, comprising:

a substrate;

a first active layer positioned on a side of the substrate, the first active layer comprising a plurality of active areas arranged at intervals;

a first word line structure comprising a plurality of first word lines arranged at intervals, each of the plurality of first word lines extending along a first direction, and each of the plurality of first word lines passing through the plurality of active areas;

a first bit line structure comprising a plurality of first bit lines arranged at intervals, each of the plurality of first bit lines extending along a second direction, each of the plurality of first bit lines being connected to a first end of a given one of the plurality of active areas, and the first direction intersecting with the second direction;

a conductive contact structure comprising a plurality of conductive contact plugs, each of the plurality of conductive contact plugs being connected to a second end of the given active area, and the first end and the second end being positioned on two sides of each of the plurality of first word lines, respectively;

a gate dielectric layer positioned on a side of the first active layer, a side of the first bit line structure, and a side of the conductive contact structure facing away from the substrate, respectively;

a second active layer positioned on a side of the gate dielectric layer facing away from the substrate;

a second word line structure positioned on a side of the second active layer facing away from the substrate, the second word line structure comprising a plurality of second word lines, each of the plurality of second word lines being connected to a first region of the second active layer; and a second bit line structure positioned on a side of the second active layer facing away from the substrate, the second bit line structure comprising a plurality of second bit lines, each of the plurality of second bit lines being connected to a second region of the second active layer;

wherein an orthographic projection of each of the plurality of conductive contact plugs on the second active layer is positioned between the first region and the second region.

10. The semiconductor structure according to claim 9, wherein the plurality of second word lines and the plurality of second bit lines extend along the first direction, an orthographic projection of each of the plurality of second bit lines on the substrate is overlapped with an orthographic projection of each of the plurality of active areas on the substrate, and an orthographic projection of each of the plurality of second word lines on the substrate is not overlapped with the orthographic projection of each of the plurality of active areas on the substrate.

11. The semiconductor structure according to claim 9, wherein the plurality of second bit lines extend along the first direction, and an orthographic projection of each of the plurality of second bit lines on the substrate is overlapped with an orthographic projection of each of the plurality of active areas on the substrate; and each of the plurality of second word lines further comprises a first conductive structure and a second conductive structure connected to each other, the first conductive structure extends along the second direction, the second conductive structure comprises a plurality of conductive plugs, each of the plurality of conductive plugs touches and connects the second active layer, and an orthographic projection of each of the plurality of conductive plugs on the substrate is not overlapped with the orthographic projection of each of the plurality of active areas on the substrate.

12. The semiconductor structure according to claim 9, further comprising a first insulating layer and an isolation structure, wherein the first insulating layer is positioned between the substrate and each of the plurality of active areas, and the isolation structure is positioned between every two of the plurality of active areas.

13. The semiconductor structure according to claim 9, wherein the conductive contact structure touches and connects a surface of the gate dielectric layer, and the first bit line structure is spaced from the surface of the gate dielectric layer.

14. The semiconductor structure according to claim 9, wherein each of the plurality of first word lines comprises a first dielectric layer and a conductive layer, the first dielectric layer is positioned between the conductive layer and each of the plurality of active areas, and a top surface of the conductive layer is lower than a top surface of each of the plurality of active areas.

15. A memory, comprising the semiconductor structure according to claim 9.

16. The memory according to claim 15, wherein there are a plurality of semiconductor structures, and the plurality of semiconductor structures are stacked along a direction perpendicular to the substrate.

* * * * *